(12) United States Patent
Lim et al.

(10) Patent No.: US 11,882,703 B2
(45) Date of Patent: Jan. 23, 2024

(54) SEMICONDUCTOR MEMORY DEVICE WITH HIGH ELECTRON MOBILITY CHANNELS AND METHOD OF MANUFACTURING THE SAME

(71) Applicant: SK hynix Inc., Icheon-si (KR)

(72) Inventors: Sungmook Lim, Icheon-si (KR); Dae Hwan Yun, Icheon-si (KR); Gil Bok Choi, Icheon-si (KR); Jae Hyeon Shin, Icheon-si (KR); In Gon Yang, Icheon-si (KR); Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 294 days.

(21) Appl. No.: 17/377,117

(22) Filed: Jul. 15, 2021

(65) Prior Publication Data
US 2022/0216231 A1 Jul. 7, 2022

(30) Foreign Application Priority Data
Jan. 7, 2021 (KR) .................. 10-2021-0002196

(51) Int. Cl.
*H10B 43/27* (2023.01)
*H01L 29/04* (2006.01)
(Continued)

(52) U.S. Cl.
CPC ......... *H10B 43/27* (2023.02); *H01L 21/0262* (2013.01); *H01L 21/02532* (2013.01);
(Continued)

(58) Field of Classification Search
CPC ........ H10B 43/27; H10B 41/27; H10B 63/34; H10B 43/10; H10B 41/10; H10B 43/35;
(Continued)

(56) References Cited

U.S. PATENT DOCUMENTS 9,685,454 B2 * 6/2017 Rabkin ............ H01L 21/02192
2015/0171106 A1 * 6/2015 Suh ........................ H10B 43/35
438/269

(Continued)

FOREIGN PATENT DOCUMENTS

KR 1020180032036 A 3/2018
KR 101995910 B1 7/2019

OTHER PUBLICATIONS

Thomas David et al., Kinetics and Energetics of Ge Condensation in SiGe Oxidation, The Journal of Physical Chemistry, American Chemical Society, Sep. 2015, 119 (43), pp. 24606-24613, HAL Id: hal-01473115, https://hal.sorbonne-universite.fr/hal-01473115.

*Primary Examiner* — Mark W Tornow
*Assistant Examiner* — David Paul Sedorook
(74) *Attorney, Agent, or Firm* — William Park & Associates Ltd.

(57) ABSTRACT

Provided herein may be a semiconductor memory device and a method of manufacturing the semiconductor memory device. The semiconductor memory device may include a stacked body including a plurality of interlayer insulating layers and a plurality of gate electrodes that are alternately stacked on a substrate, and a plurality of channel structures configured to vertically pass through the stacked body. Each of the plurality of channel structures may include a core insulating layer, a first channel layer, a second channel layer, a tunnel insulating layer, and a charge storage layer that extend vertically towards the substrate. Electron mobility of the first channel layer may be higher than electron mobility of the second channel layer.

12 Claims, 16 Drawing Sheets

(51) Int. Cl.
*H01L 29/165* (2006.01)
*H01L 29/10* (2006.01)
*H01L 21/02* (2006.01)
*H10B 41/27* (2023.01)
*H10B 63/00* (2023.01)

(52) U.S. Cl.
CPC ........ *H01L 21/02595* (2013.01); *H01L 29/04* (2013.01); *H01L 29/1054* (2013.01); *H01L 29/165* (2013.01); *H10B 41/27* (2023.02); *H10B 63/34* (2023.02)

(58) Field of Classification Search
CPC ................ H10B 43/30; H01L 29/1054; H01L 27/11582; H01L 27/11556; H01L 27/2454; H01L 27/11565; H01L 27/11519; H01L 27/1157; H01L 27/11568; H01L 21/02532; H01L 21/02595; H01L 21/0262; H01L 29/165
See application file for complete search history.

(56) References Cited

U.S. PATENT DOCUMENTS

| | | | |
|---|---|---|---|
| 2016/0027796 A1* | 1/2016 | Yang | H10B 43/50 257/314 |
| 2017/0103998 A1* | 4/2017 | Chang | H10B 43/20 |
| 2017/0186754 A1* | 6/2017 | Blomberg | H10B 43/27 |
| 2017/0263623 A1* | 9/2017 | Zhang | H10B 43/27 |
| 2020/0212060 A1* | 7/2020 | Yoo | G11C 16/0483 |
| 2020/0328229 A1* | 10/2020 | Kim | H10B 41/27 |
| 2021/0265380 A1* | 8/2021 | Obu | H01L 29/41741 |
| 2021/0375936 A1* | 12/2021 | Chiang | H01L 29/40111 |
| 2022/0005830 A1* | 1/2022 | Wu | H01L 29/6684 |

* cited by examiner

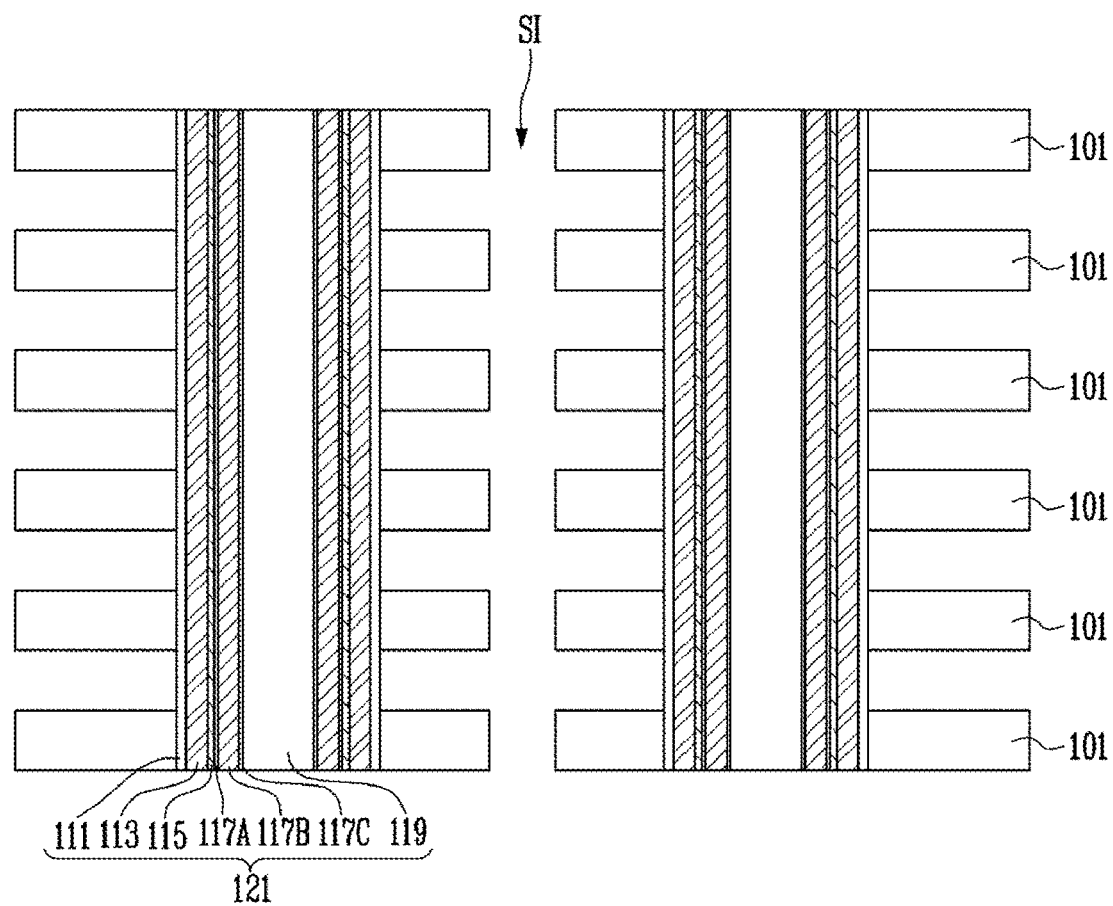

SEMICONDUCTOR MEMORY DEVICE WITH HIGH ELECTRON MOBILITY CHANNELS AND METHOD OF MANUFACTURING THE SAME

CROSS-REFERENCE TO RELATED APPLICATION

The present application claims priority under 35 U.S.C. § 119(a) to Korean patent application number 10-2021-0002196, filed on Jan. 7, 2021, in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device of a vertical channel structure and a method of manufacturing the semiconductor memory device.

2. Related Art

Recently, the paradigm for computer environment has been converted into ubiquitous computing so that computer systems can be used at anytime and anywhere. Therefore, the use of portable electronic devices, such as mobile phones, digital cameras, and notebook computers has rapidly increased. In general, such portable electronic devices use a memory system that employs a semiconductor memory device, in other words, a data storage device. The data storage device is used as a main memory device or an auxiliary memory device of the portable electronic devices.

A data storage device that uses a semiconductor memory device provides advantages in that, since there is no mechanical driver, stability and durability are excellent, information access speed is high, and power consumption is reduced. Examples of a data storage device proposed as the memory system with such advantages may include a universal serial bus (USB) memory device, a memory card with various interfaces, and a solid state drive (SSD).

Semiconductor memory devices are mainly classified into a volatile memory device and a nonvolatile memory device.

Although read and write speeds are comparatively low, the nonvolatile memory device can retain data that is stored therein even when power supply is interrupted. Therefore, the nonvolatile memory device is used when there is the need for storing data that should be maintained regardless of the supply of power. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

SUMMARY

An embodiment of the present disclosure may provide for a semiconductor memory device including a stacked body including a plurality of interlayer insulating layers and a plurality of gate electrodes that are alternately stacked on a substrate, and a plurality of channel structures configured to vertically pass through the stacked body. Each of the plurality of channel structures may include a core insulating layer, a first channel layer, a second channel layer, a tunnel insulating layer, and a charge storage layer that extend vertically towards the substrate. Electron mobility of the first channel layer may be higher than electron mobility of the second channel layer.

An embodiment of the present disclosure may provide for a semiconductor memory device including a stacked body including a plurality of interlayer insulating layers and a plurality of gate electrodes that are alternately stacked on a substrate, and a plurality of channel structures configured to vertically pass through the stacked body. Each of the plurality of channel structures may include a core insulating layer, a first channel layer, a second channel layer, a tunnel insulating layer, and a charge storage layer that extend vertically towards the substrate, the first channel layer may enclose the core insulating layer and the second channel layer may enclose the first channel layer, and electron mobility of the second channel layer may be higher than electron mobility of the first channel layer.

An embodiment of the present disclosure may provide for a method of manufacturing a semiconductor memory device including forming a stacked body by alternately stacking a plurality of interlayer insulating layers and a plurality of sacrificial layers on a substrate; forming a plurality of holes configured to vertically pass through the stacked body; and successively forming a blocking insulating layer, a charge storage layer, a tunnel insulating layer, a first channel layer, and a second channel layer on a sidewall of each of the plurality of holes. The second channel layer may be a material layer having higher electron mobility than the first channel layer.

An embodiment of the present disclosure may provide for a method of manufacturing a semiconductor memory device including forming a stacked body by alternately stacking a plurality of interlayer insulating layers and a plurality of sacrificial layers on a substrate; forming a plurality of holes configured to vertically pass through the stacked body; and successively forming a blocking insulating layer, a charge storage layer, a tunnel insulating layer, a first channel layer, and a second channel layer on a sidewall of each of the plurality of holes. The first channel layer may be a material layer having higher electron mobility than the second channel layer.

BRIEF DESCRIPTION OF THE DRAWINGS

FIGS. 6A to 6F are sectional views illustrating a method of manufacturing a memory cell array in accordance with an embodiment of the present disclosure.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described more fully hereinafter with reference to the accompanying drawings, in which preferred embodiments of the present disclosure are shown, so that those of ordinary skill in the art can easily carry out the technical idea of the present disclosure.

Various embodiments of the present disclosure are directed to a semiconductor memory device and a method of manufacturing the semiconductor memory device, in which a channel layer is formed of a multi-layered structure in the semiconductor memory device with a vertical channel structure, thus improving channel mobility.

Figure 1:
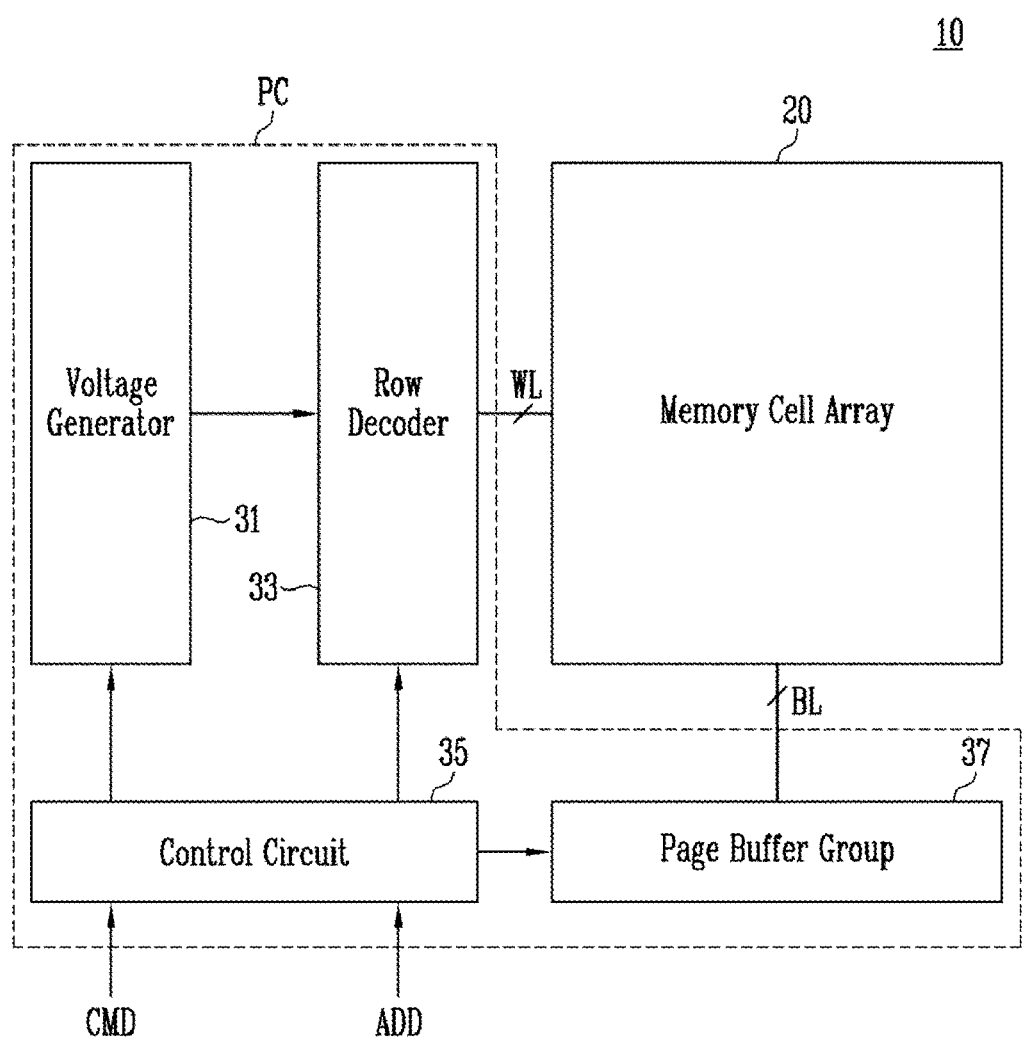
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 10 may include a peripheral circuit PC and a memory cell array 20.

The peripheral circuit PC may be configured to control a program operation for storing data in the memory cell array 20, a read operation for outputting the data that is stored in the memory cell array 20, or an erase operation for erasing the data that is stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be coupled to the row decoder 33 via word lines WL and may be coupled to the page buffer group 37 via bit lines BL.

The control circuit 35 may control the peripheral circuit PC in response to a command CMD and an address ADD.

The voltage generator 31 may generate various operating voltages, such as a pre-erase voltage, an erase voltage, a ground voltage, a program voltage, a verification voltage, a pass voltage, and a read voltage, used for the program operation, the read operation, and the erase operation, in response to the control circuit 35.

The row decoder 33 may select a memory block in response to the control circuit 35. The row decoder 33 may be configured to apply the operating voltages to word lines WL coupled to the selected memory block.

The page buffer group 37 may be coupled to the memory cell array 20 through the bit lines BL. The page buffer group 37 may temporarily store data received from an input/output circuit (not shown) during the program operation in response to the control circuit 39. The page buffer group 37 may sense the voltage or current of the bit lines BL during the read operation or the verification operation in response to the control circuit 35. The page buffer group 37 may select the bit lines BL in response to the control circuit 35.

Structurally, the memory cell array 20 may overlap a portion of the peripheral circuit PC.

Figure 2:
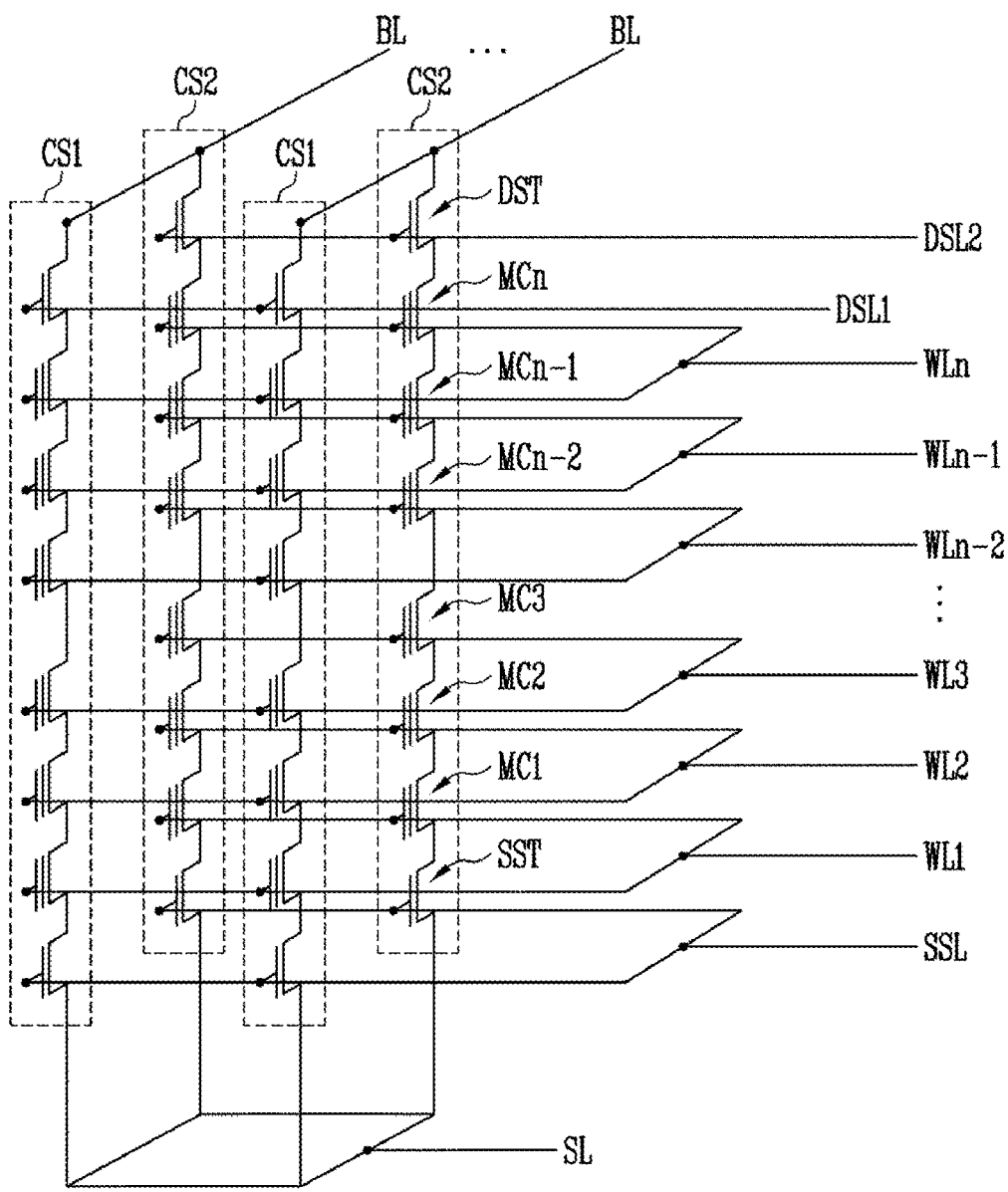
FIG. 2 is a circuit diagram illustrating a memory cell array of FIG. 1.

FIG. 2 is a circuit diagram illustrating the memory cell array of FIG. 1.

Referring to FIG. 2, the memory cell array 20 may include a plurality of cell strings CS1 and CS2 that are coupled between a source line SL and a plurality of bit lines BL. The plurality of cell strings CS1 and CS2 may be coupled in common to a plurality of word lines WL1 to WLn.

Each of the cell strings CS1 and CS2 may include at least one source select transistor SST that is coupled to the source line SL, at least one drain select transistor DST that is coupled to the bit line BL, and a plurality of memory cells MC1 to MCn that are coupled in series between the source select transistor SST and the drain select transistor DST.

Gates of the memory cells MC1 to MCn may be coupled, respectively, to the plurality of word lines WL1 to WLn that are spaced apart from each other and stacked. The plurality of word lines WL1 to WLn may be disposed between the source select line SSL and two or more drain select lines DSL1 and DSL2. The two or more drain select lines DSL1 and DSL2 may be spaced apart from each other at the same level.

A gate of the source select transistor SST may be coupled to the source select line SSL. The gate of the drain select transistor DST may be coupled to the drain select line that corresponds to the gate of the drain select transistor DST.

The source line SL may be coupled to the source of the source select transistor SST. The drain of the drain select transistor DST may be coupled to a bit line that corresponds to the drain of the drain select transistor DST.

The plurality of cell strings CS1 and CS2 may be divided into string groups that are coupled to two or more drain select lines DSL1 and DSL2, respectively. The cell strings that are coupled to the same word line and the same bit line may be independently controlled by different drain select lines. Furthermore, the cell strings that are coupled to the same drain select line may be independently controlled by different bit lines.

In an embodiment, two or more drain select lines DSL1 and DSL2 may include a first drain select line DSL1 and a second drain select line DSL2. The plurality of cell strings CS1 and CS2 may include a first cell string CS1 of a first string group that is coupled to the first drain select line DSL1, and a second cell string CS2 of a second string group that is coupled to the second drain select line DSL2.

Figure 3A:
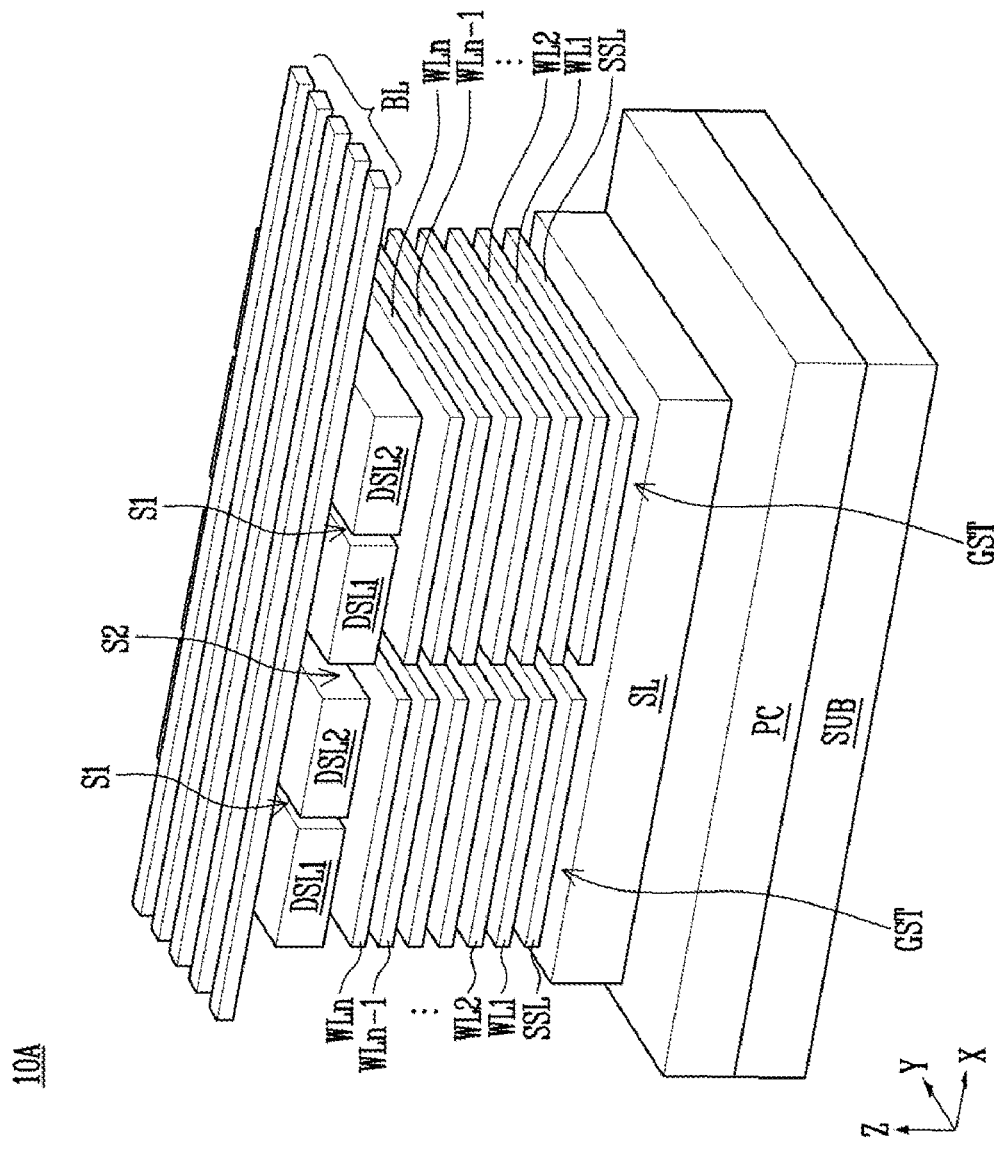
FIGS. 3A and 3B are perspective views schematically illustrating semiconductor memory devices in accordance with embodiments of the present disclosure.
Figure 3B:
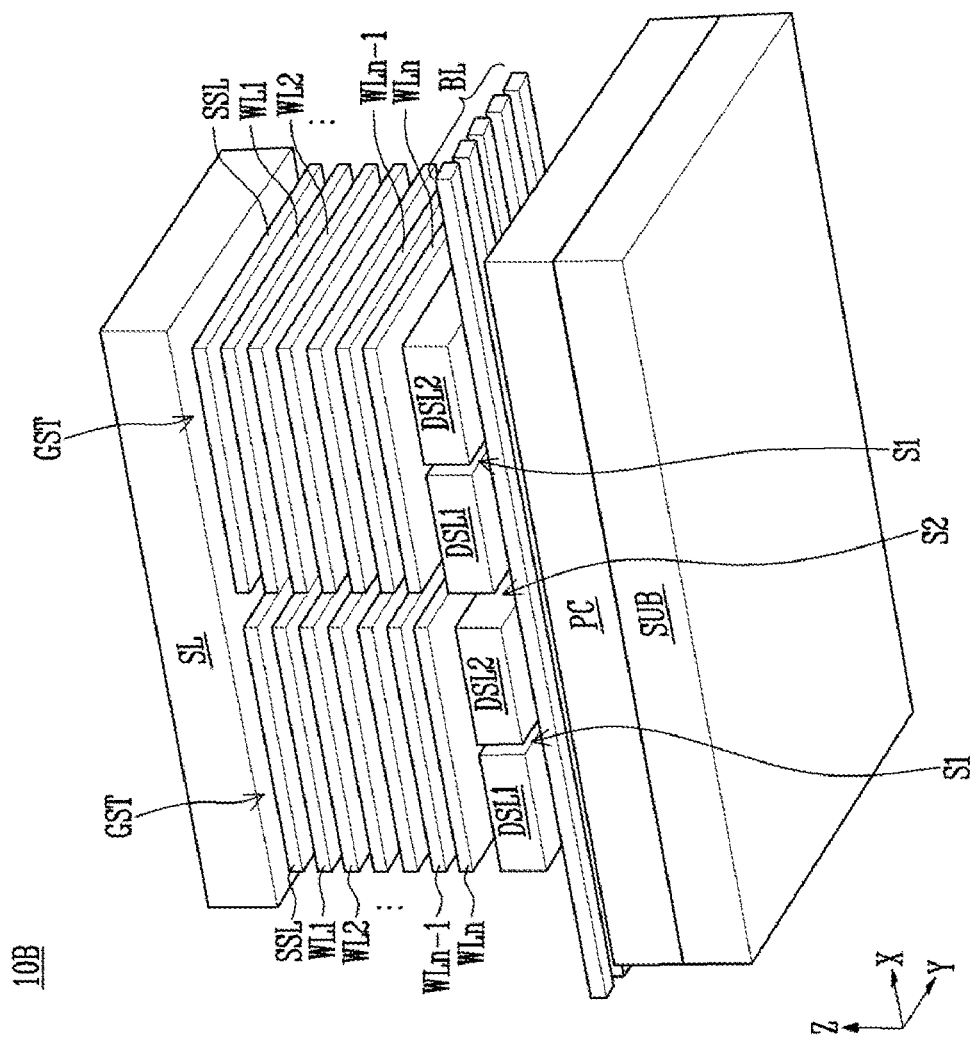

FIGS. 3A and 3B are perspective views schematically illustrating semiconductor memory devices in accordance with embodiments of the present disclosure.

Referring to FIGS. 3A and 3B, each of the semiconductor memory devices 10A and 10B may include a peripheral circuit PC that is disposed on a substrate SUB and gate stacked bodies GST that overlaps the peripheral circuit PC.

Each of the gate stacked bodies GST may include the source select line SSL, the plurality of word lines WL1 to WLn, and two or more drain select lines DSL1 and DSL2 that are separated from each other by a first slit S1 at the same level.

The source select line SSL and the plurality of word lines WL1 to WLn may extend in a first direction X and a second direction Y, and may be formed in the shape of a flat plate that is parallel to the upper surface of the substrate SUB. Referring to FIG. 3A, The first direction X may be the X axis as in the XYZ coordinate system, and the second direction Y may be the Y axis as in the XYZ coordinate system.

The plurality of word lines WL1 to WLn may be stacked while being spaced apart from each other in the third direction Z. Referring to FIG. 3A, the third direction Z may be the Z axis as in the XYZ coordinate system. The plurality of word lines WL1 to WLn may be disposed between two or more drain select lines DSL1 and DSL2 and the source select line SSL.

The gate stacked bodies GST may be separated from each other by a second slit S2. The first slit S1 may be formed to be shorter in the third direction Z than the second slit S2 and may overlap the plurality of word lines WL1 to WLn.

Each of the first slit S1 and the second slit S2 may extend in a linear shape, a zigzag shape, or a wave shape. The width of each of the first slit S1 and the second slit S2 may be varied according to a design rule.

Referring to FIG. 3A, the source select line SSL, in accordance with an embodiment, may be disposed to be closer to the peripheral circuit PC than the two or more drain select lines DSL1 and DSL2.

The semiconductor memory device 10A may include a source line that is disposed between gate stacked bodies GST and a peripheral circuit PC, and a plurality of bit lines BL that is spaced farther from the peripheral circuit PC compared to the source line SL. The gate stacked bodies GST may be disposed between the plurality of bit lines BL and the source line SL.

Referring to FIG. 3B, the two or more drain select lines DSL1 and DSL2, in accordance with an embodiment, may be disposed to be closer to the peripheral circuit PC than the source select line SSL.

The semiconductor memory device 10B may include a plurality of bit lines BL that are disposed between gate stacked bodies GST and a peripheral circuit PC, and the semiconductor memory device 10B may include a source line SL that is spaced farther from the peripheral circuit PC than the bit lines BL. The gate stacked bodies GST may be disposed between the plurality of bit lines BL and the source line SL.

Referring back to FIGS. 3A and 3B, the plurality of bit lines BL may be formed of various conductive materials. The source line SL may include a doped semiconductor layer. In an embodiment, the source line SL may include an n-type doped silicon layer.

Although not shown in the drawing, the peripheral circuit PC may be electrically coupled to the plurality of bit lines BL, the source line SL, and the plurality of word lines WL1 to WLn through interconnections of various structures.

Figure 4:
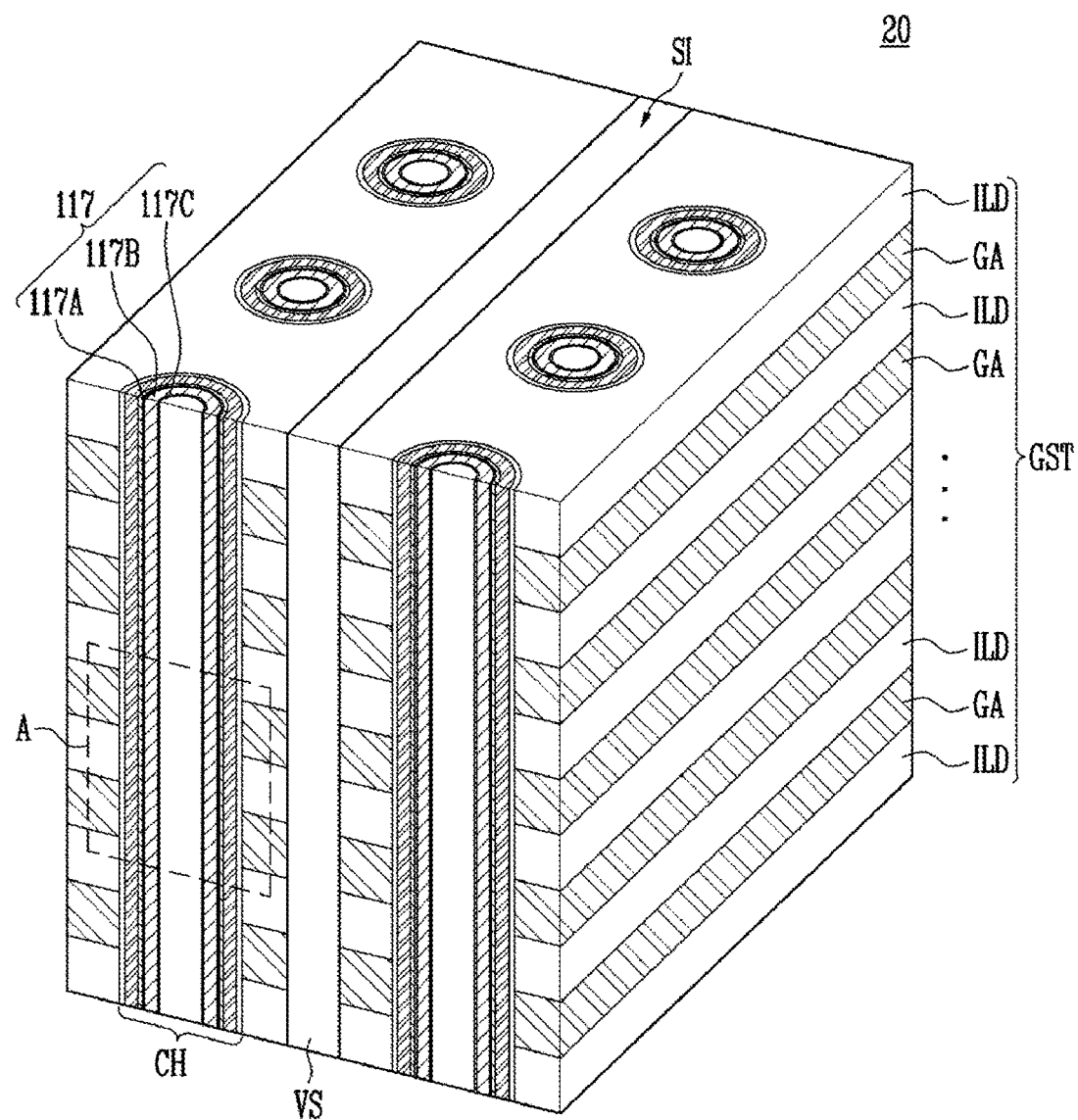
FIG. 4 is a perspective view illustrating a portion of the memory cell array of the semiconductor memory device in accordance with an embodiment of the present disclosure.

FIG. 4 is a perspective view illustrating a portion of the memory cell array of the semiconductor memory device in accordance with an embodiment of the present disclosure.

Referring to FIG. 4, the memory cell array 20 may include gate stacked bodies GST that are separated from each other by a slit SI, and channel structures CH configured to pass through the gate stacked bodies GST, respectively.

The slit SI may be filled with a vertical structure VS. In an embodiment, the vertical structure VS may include an insulating material.

Each of the gate stacked bodies GST may include interlayer insulating layers ILD and gate electrodes GA that are alternately stacked in one direction. Hereinafter, the direction in which the interlayer insulating layers ILD and the gate electrodes GA are alternately stacked is referred to as the stacking direction.

At least one gate electrode that is disposed on the lowermost layer among the gate electrodes GA may be used as a source select line, while at least one gate electrode that is disposed on the uppermost layer may be used as a drain select line.

The gate electrodes GA may include at least one of a doped semiconductor, metal, metal silicide, or a metal nitride layer. The gate electrodes GA may be used as the gate electrode of the memory cell or the gate electrode of the select transistor.

The channel structure CH may extend in the stacking direction and may be enclosed with the gate electrodes GA.

The channel structure CH, in accordance with an embodiment of the present disclosure, may include a channel layer 117 with a multi-layer structure. For example, the channel layer 117 may include a first channel layer 117A, a second channel layer 117B, and a third channel layer 117C. In an embodiment, the first channel layer 117A and the third channel layer 117C may each be formed of polysilicon (Si), and the second channel layer 117B may be formed of silicon germanium (SiGe) having higher electron mobility than polysilicon (Si). In another embodiment, the first channel layer 117A and the third channel layer 117C may each be formed of silicon germanium (SiGe), and the second channel layer 117B may be formed of polysilicon (Si). Thus, the channel mobility of the channel layer 117 may improve, which in turn, leads to the electrical characteristics of the memory cells improving.

As the embodiment of the present disclosure, there has been described an example where at least one gate stacked body that is disposed on the lowermost layer among the gate stacked bodies GST may be used as the source select line, while at least one gate stacked body that is disposed on the uppermost layer may be used as the drain select line, as illustrated in FIG. 3A. However, without being limited thereto, at least one gate stacked body that is disposed on the lowermost layer among the gate stacked bodies GST may be used as the drain select line, while at least one gate stacked body disposed on the uppermost layer may be used as the source select line, as illustrated in FIG. 3B.

Figure 5:
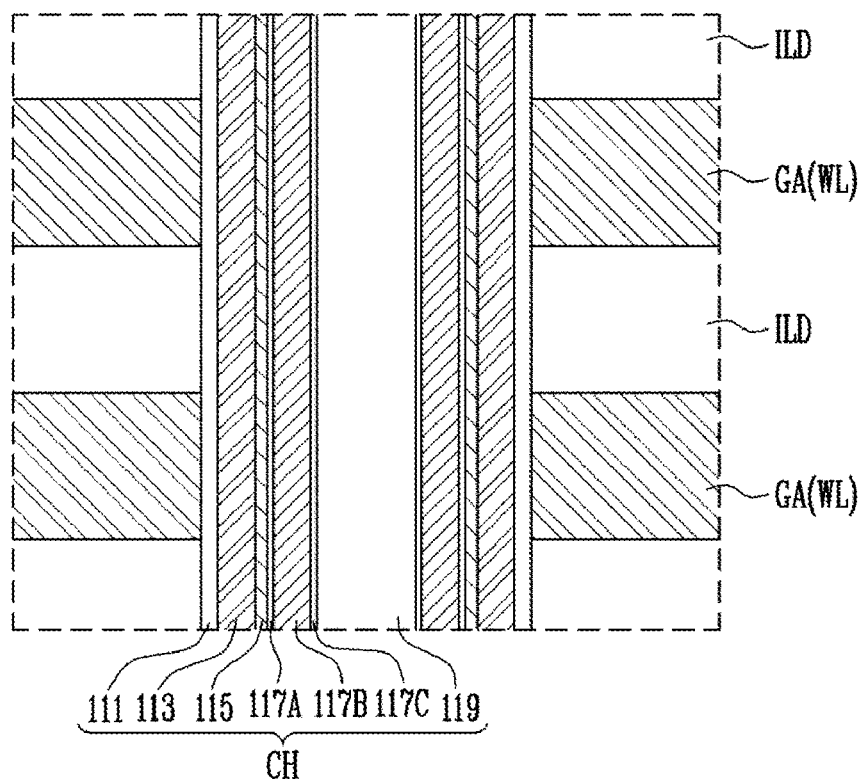
FIG. 5 is an enlarged view of area A of FIG. 4.

FIG. 5 is an enlarged view of area A of FIG. 4.

Referring to FIG. 5, the channel structure CH may include a blocking insulating layer 111, a charge storage layer 113, a tunnel insulating layer 115, a first channel layer 117A, a second channel layer 117B, a third channel layer 117C, and a core insulating layer 119, which extend in a vertical direction.

The core insulating layer 119 may extend in a vertical direction on a central area of the channel structure CH and may be formed of an insulating layer, such as an oxide layer.

The first channel layer 117A, the second channel layer 117B, and the third channel layer 117C may be used as the channel area of the cell string. For example, in an embodiment, the first channel layer 117A and the third channel layer 117C may each be formed of polysilicon (Si), and the second channel layer 117B may be formed of silicon germanium (SiGe). The first channel layer 117A may include a silicon oxide layer ($SiO_2$) on an interface where the first channel layer is in contact with the tunnel insulating layer 115. The third channel layer 117C may include a silicon oxide layer ($SiO_2$) on an interface where the third channel layer is in contact with the core insulating layer 119.

In an embodiment, the first channel layer 117A and the third channel layer 117C may each be formed of silicon germanium (SiGe), and the second channel layer 117B may be formed of polysilicon (Si). The electron mobility of the channel layer is improved by the first channel layer 117A and the third channel layer 117C. Furthermore, the second channel layer 117B may be subjected to the tensile stress that is caused by the first channel layer 117A and the third channel layer 117C, resulting in the improvement of electron mobility of the second channel layer 117B.

The tunnel insulating layer 115 may enclose a sidewall of the first channel layer 117A. The tunnel insulating layer 115 may be formed of a silicon oxide layer that makes charge tunneling possible.

The charge storage layer 113 may enclose a sidewall of the tunnel insulating layer 115. The charge storage layer 113 may be formed of a material layer that may store data that is changed by using Fowler-Nordheim tunneling. In an embodiment, the charge storage layer 113 may be formed of a charge trap nitride layer.

The blocking insulating layer 111 may enclose a sidewall of the charge storage layer 113. The blocking insulating layer 111 may include an oxide layer that is capable of blocking charges.

As described above, in an embodiment of the present disclosure, the first and third channel layers 117A and 117C may be formed of polysilicon, and the second channel layer 117B may be formed of silicon germanium having higher electron mobility than polysilicon, thus improving the channel mobility of the channel layer. Furthermore, in another embodiment, the second channel layer 117B may be formed of polysilicon, and the first and third channel layers 117A and 117C may be formed of silicon germanium with electron mobility higher than that of polysilicon, thus improving the channel mobility of the channel layer.

FIGS. 6A to 6F are sectional views illustrating a method of manufacturing a memory cell array in accordance with an embodiment of the present disclosure.

Figure 6A:

Referring to FIG. 6A, a stacked body ST may be formed by alternately stacking interlayer insulating layers 101 and sacrificial layers 103. The stacked body ST may be formed on a substrate (not shown) with a peripheral circuit.

The sacrificial layers 103 may be made of a different material compared to the interlayer insulating layers 101. For example, the interlayer insulating layers 101 may be formed of oxide, such as a silicon oxide layer. The sacrificial layers 103 may be formed of material with a different etching rate compared to the interlayer insulating layers 101. For example, the sacrificial layers 103 may be formed of a nitride, such as a silicon nitride layer.

Figure 6B:
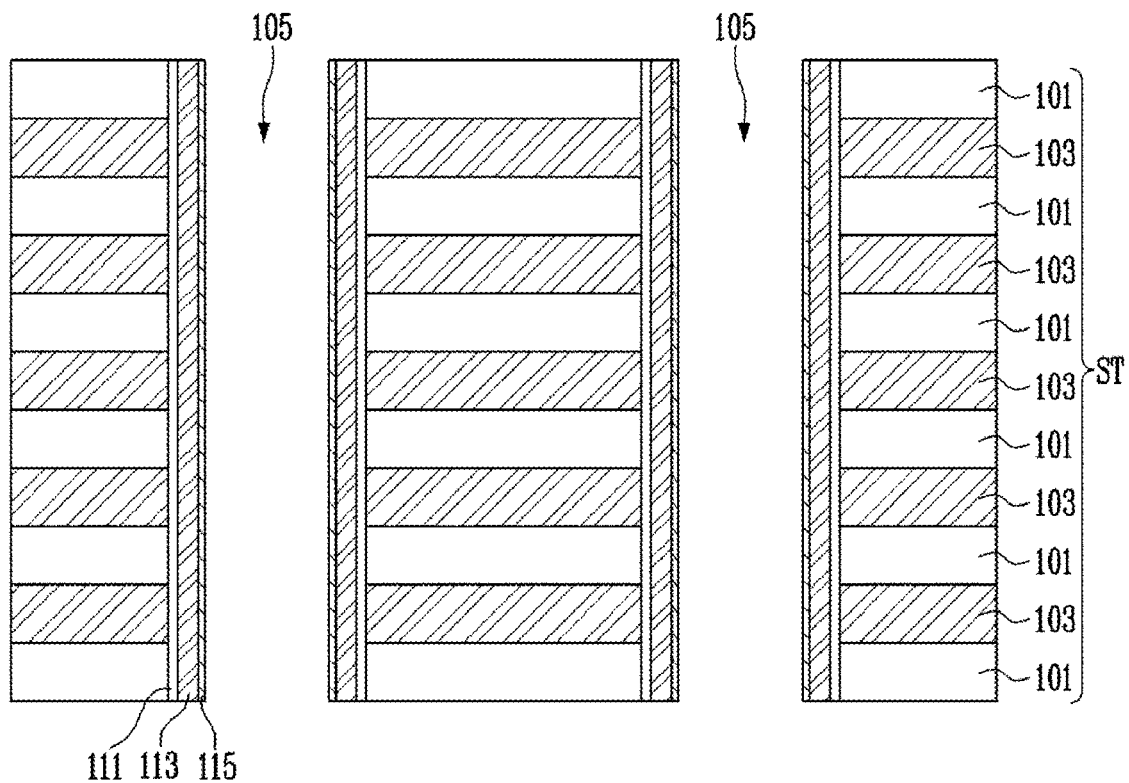

Referring to FIG. 6B, holes 105 configured to pass through the stacked body ST are formed. Subsequently, the blocking insulating layer 111, the charge storage layer 113, and the tunnel insulating layer 115 may be successively formed on the sidewall of the holes 105.

The blocking insulating layer 111 may include an oxide layer that is capable of blocking charges. In an embodiment, the blocking insulating layer 111 may be formed of $Al_2O_3$.

The charge storage layer 113 may be formed of a charge trap layer, a material layer with conductive nanodots, or a phase-change material layer. For example, the charge storage layer 113 may store data that is changed by using the Fowler-Nordheim tunneling. To this end, the charge storage layer 113 may be formed of a silicon nitride layer that is capable of trapping charges.

The tunnel insulating layer 115 may be formed of a silicon oxide layer that makes charge tunneling possible.

Figure 6C:
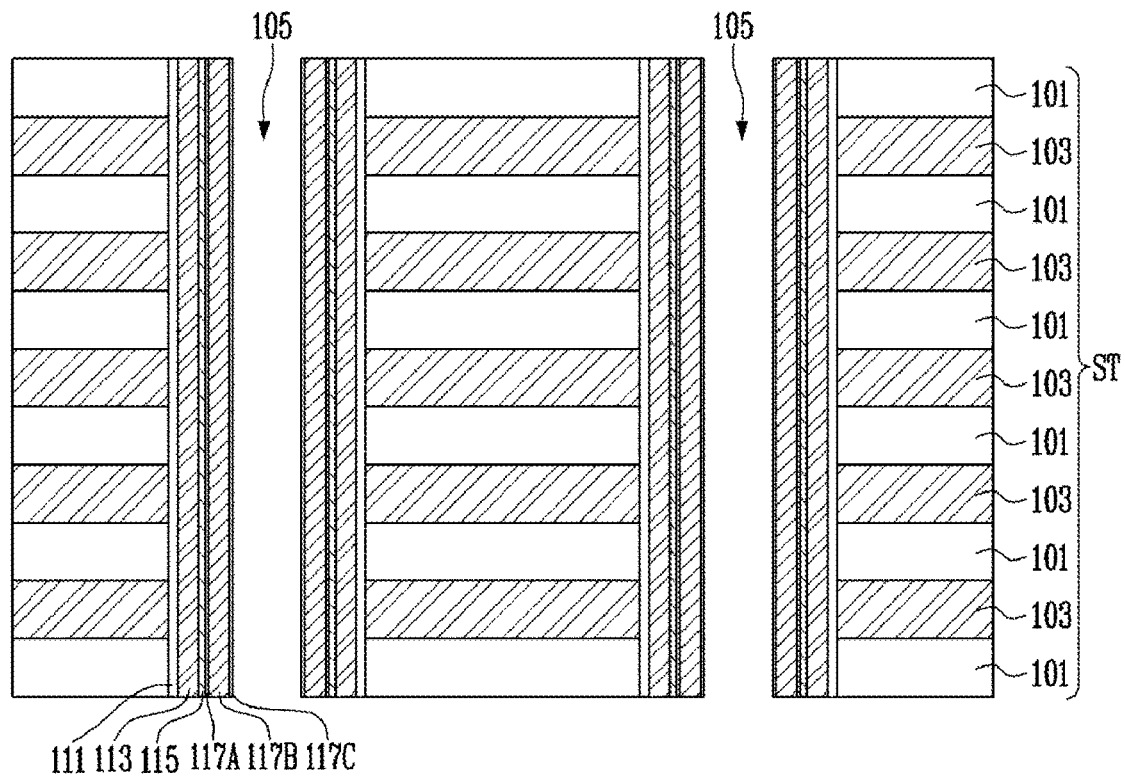

Referring to FIG. 6C, the first channel layer 117A, the second channel layer 117B, and the third channel layer 117C may be successively formed on the sidewall of the tunnel insulating layer 115 inside the holes 105.

The first channel layer 117A and the third channel layer 117C may each be formed of polysilicon (Si), and the second channel layer 117B may be formed of silicon germanium (SiGe). The first channel layer 117A, the second channel layer 117B, and the third channel layer 117C may be formed by using an ALD process. The first channel layer 117A, the second channel layer 117B, and the third channel layer 117C may be separately formed by using a super cycle method in which the numbers of Si cycles and Ge cycles are controlled in the process of forming the first channel layer 117A, the second channel layer 117B, and the third channel layer 117C, and the composition ratio of Si and Ge in the second channel layer 117B may be adjusted.

A portion of the first channel layer 117A that is formed on the interface of the tunnel insulating layer 115 may be replaced with a silicon oxide layer.

Figure 6D:
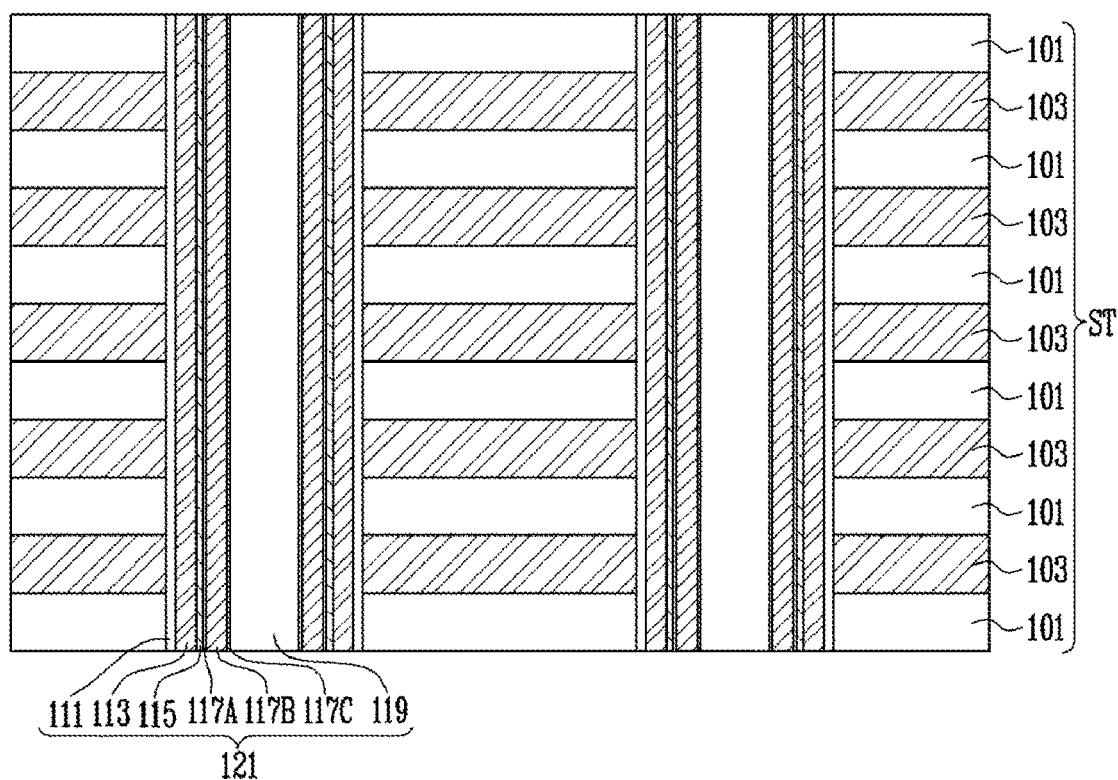

Referring to FIG. 6D, the central area of the holes may be filled with the core insulating layer 119 to form the channel structure 121. The core insulating layer 119 may be formed of an oxide layer. In the process of forming the core insulating layer 119, a portion of the third channel layer 117C that is in contact with the core insulating layer 119 may be replaced with a silicon oxide layer.

Referring to FIG. 6E, a slit SI configured to pass through the stacked body ST may be formed. The sidewall of the sacrificial layers 103, shown in FIG. 6C, may be exposed by the slit SI. Subsequently, the sacrificial layers 103, shown in FIG. 6C, may be removed through the slit SI. Thus, openings configured to expose the side of the blocking insulating layer 111 may be formed. The openings may be defined between the interlayer insulating layers 101.

Figure 6F:
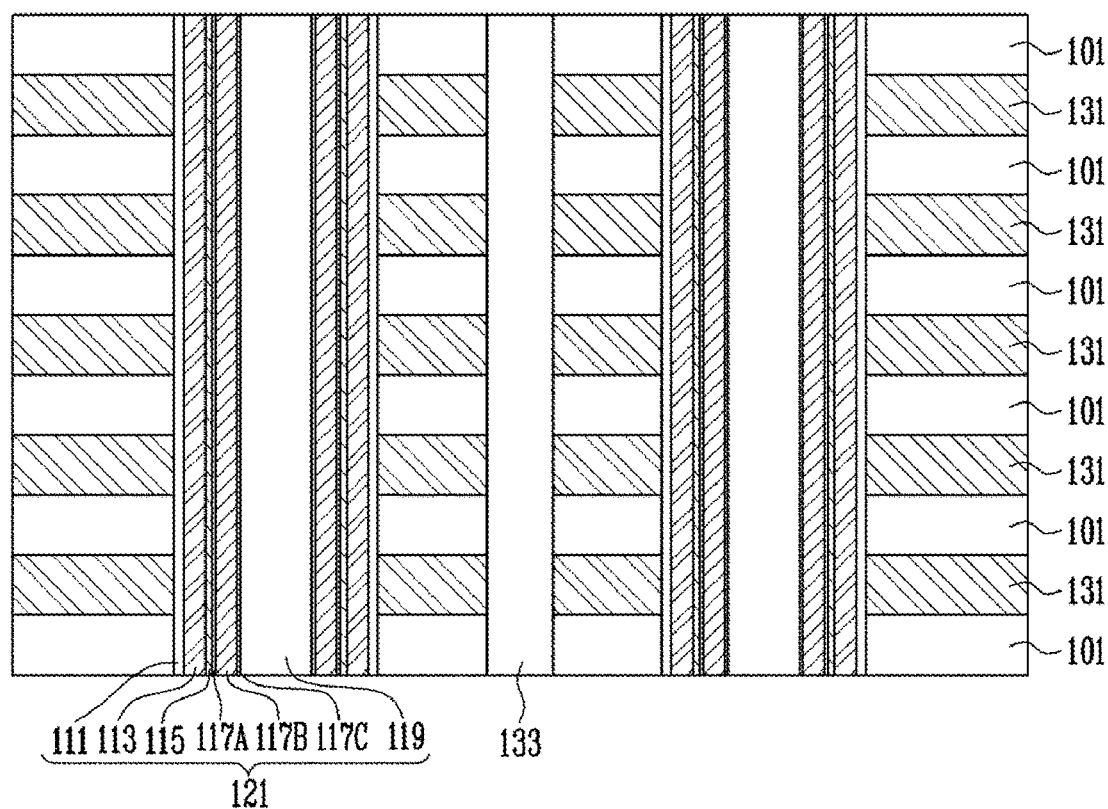

Referring to FIG. 6F, the space that is removed by the sacrificial layers, i.e. the openings, may be filled with the gate electrodes 131. For example, after the conductive material is deposited to fill the openings, the conductive material in the slit may be removed so that the conductive material is separated into the gate electrodes 131 by the slit. Thereafter, the slit is filled with the insulating material to form a vertical structure 133.

In an embodiment of the present disclosure, the first and third channel layers 117A and 117C may be formed of polysilicon, and the second channel layer 117B may be formed of silicon germanium having higher electron mobility than polysilicon, thus improving the electron mobility of the channel layer.

In the above-described embodiment, the first and third channel layers 117A and 117C may be formed of polysilicon, and the second channel layer 117B may be formed of silicon germanium. However, in another embodiment, the first and third channel layers 117A and 117C may be formed of silicon germanium, and the second channel layer 117B may be formed of polysilicon. In this case, the electron mobility of the channel layer may be improved by the electron mobility of the first and third channel layers 117A and 117C, and the electron mobility of the second channel layer 117B may be improved due to the tensile stress that is caused by the first and third channel layers 117A and 117C. Furthermore, the first and third channel layers 117A and 117C may mitigate the compressive stress that is caused by the tunnel insulating layer 115 and the core insulating layer 119 and may prevent oxygen from being diffused from the tunnel insulating layer 115 and the core insulating layer 119, thus improving the electron mobility of the channel layers 117A, 117B, and 117C.

Figure 7:
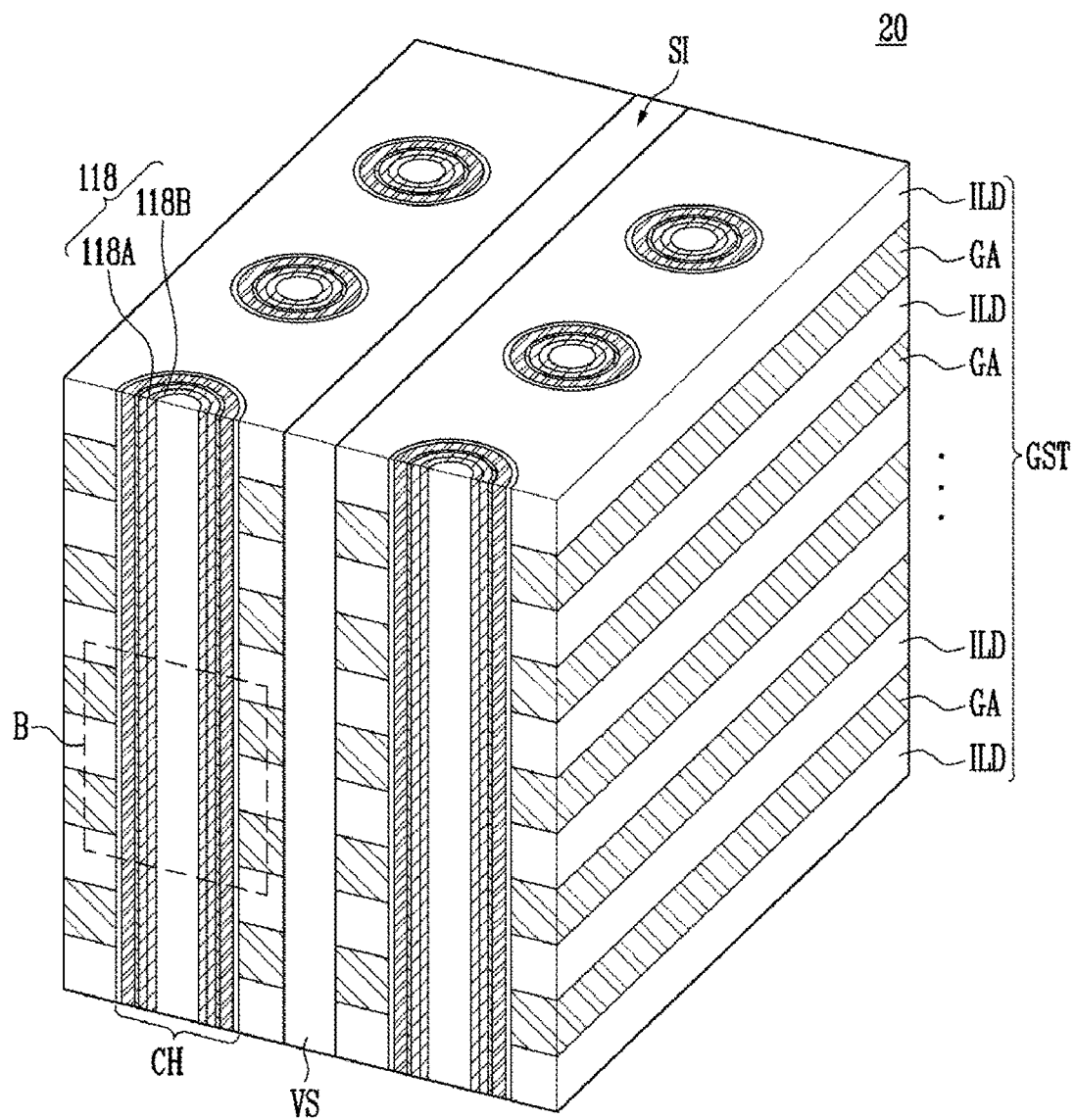
FIG. 7 is a perspective view illustrating a portion of a memory cell array of a semiconductor memory device in accordance with an embodiment of the present disclosure.

FIG. 7 is a perspective view illustrating a portion of a memory cell array of a semiconductor memory device in accordance with an embodiment of the present disclosure.

Referring to FIG. 7, the memory cell array 20 may include gate stacked bodies GST that are separated from each other by a slit SI, and channel structures CH configured to pass through the gate stacked bodies GST, respectively.

The slit SI may be filled with a vertical structure VS. In an embodiment, the vertical structure VS may include an insulating material.

Each of the gate stacked bodies GST may include interlayer insulating layers ILD and gate electrodes GA that are alternately stacked in one direction. Hereinafter, the direction in which the interlayer insulating layers ILD and the gate electrodes GA are alternately stacked is referred to as a stacking direction.

At least one gate electrode that is disposed on the lowermost layer among the gate electrodes GA may be used as a source select line, while at least one gate electrode that is disposed on the uppermost layer may be used as a drain select line.

The gate electrodes GA may include at least one of a doped semiconductor, metal, metal silicide, or a metal nitride layer. The gate electrodes GA may be used as the gate electrode of the memory cell or the gate electrode of the select transistor.

The channel structure CH may extend in the stacking direction and may be enclosed with the gate electrodes GA.

The channel structure CH, in accordance with an embodiment of the present disclosure, may include a channel layer 118 with a multi-layer structure. For example, the channel layer 118 may include a first channel layer 118A and a second channel layer 118B. In an embodiment, the first channel layer 118A may be formed of polysilicon (Si), and the second channel layer 118B may be formed of silicon germanium (SiGe) having higher electron mobility than polysilicon (Si). In an embodiment, the first channel layer 118A may be formed of silicon germanium (SiGe), and the second channel layer 118B may be formed of polysilicon (Si). Thus, the channel mobility of the channel layer 118 may be improved, and the electrical characteristics of the memory cells may be improved.

Referring to the embodiment of the present disclosure, there has been described an example in which at least one gate stacked body that is disposed on the lowermost layer among the gate stacked bodies GST may be used as the source select line, while at least one gate stacked body that is disposed on the uppermost layer may be used as the drain select line, as illustrated in FIG. 3A. However, without being limited thereto, at least one gate stacked body that is disposed on the lowermost layer among the gate stacked bodies GST may be used as the drain select line, while at least one gate stacked body that is disposed on the uppermost layer may be used as the source select line, as illustrated in FIG. 3B.

Figure 8:
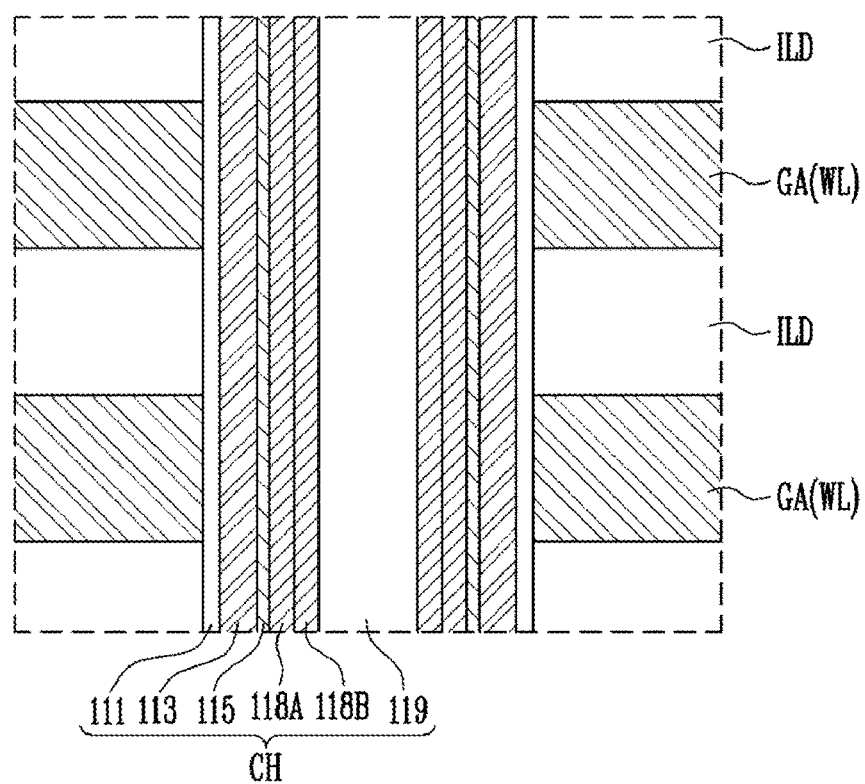
FIG. 8 is an enlarged view of area B of FIG. 7.

FIG. 8 is an enlarged view of area B of FIG. 7.

Referring to FIG. 8, the channel structure CH may include a blocking insulating layer 111, a charge storage layer 113, a tunnel insulating layer 115, a first channel layer 118A, a second channel layer 118B, and a core insulating layer 119, which extend in a vertical direction.

The core insulating layer 119 may extend in a vertical direction within a central area of the channel structure CH and may be formed of an insulating layer, such as an oxide layer.

The first channel layer 118A and the second channel layer 118B may be used as the channel area of the cell string. For example, in an embodiment, the first channel layer 118A may be formed of polysilicon (Si), and the second channel layer 118B may be formed of silicon germanium (SiGe). The first channel layer 118A may include a silicon oxide layer ($SiO_2$) on an interface in which the first channel layer is in contact with the tunnel insulating layer 115. The second channel layer 118B may include a silicon oxide layer ($SiO_2$) on an interface in which the second channel layer is in contact with the core insulating layer 119.

In another embodiment, the first channel layer 118A may be formed of silicon germanium (SiGe), and the second channel layer 118B may be formed of polysilicon (Si).

As described above, in an embodiment of the present disclosure, the channel layer may be formed of a double layer with silicon germanium, and the electron mobility of the channel layer may be improved because of the incorporation of silicon germanium.

The tunnel insulating layer 115 may enclose a sidewall of the first channel layer 118A. The tunnel insulating layer 115 may be formed of a silicon oxide layer that makes charge tunneling possible.

The charge storage layer 113 may enclose a sidewall of the tunnel insulating layer 115. The charge storage layer 113 may be formed of a material layer that may store data that is changed by using the Fowler-Nordheim tunneling. In an embodiment, the charge storage layer 113 may be formed of a charge trap nitride layer.

The blocking insulating layer 111 may enclose a sidewall of the charge storage layer 113. The blocking insulating layer 111 may include an oxide layer that is capable of blocking charges.

Figure 9:
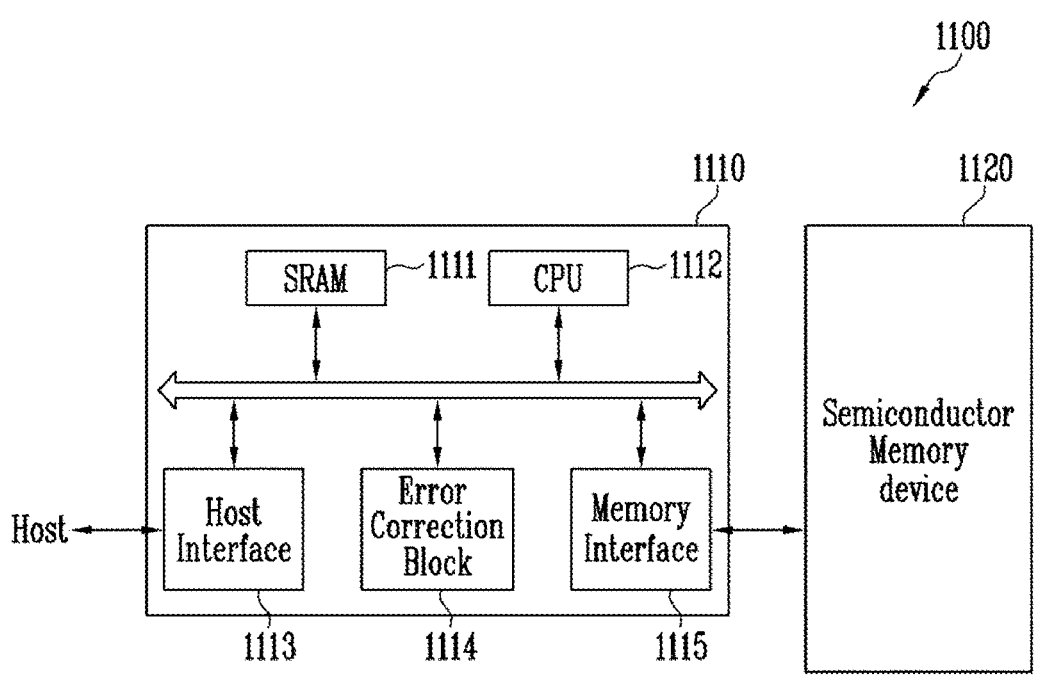
FIG. 9 is a block diagram illustrating the configuration of a memory system in accordance with an embodiment of the present disclosure.

FIG. 9 is a block diagram illustrating the configuration of a memory system 1100 in accordance with an embodiment of the present disclosure.

Referring to FIG. 9, the memory system 1100 may include a semiconductor memory device 1120 and a memory controller 1110.

The semiconductor memory device 1120 may include a plurality of channel structures configured to pass through a stacked structure in which a plurality of interlayer insulating layers and a plurality of gate electrodes are alternately stacked. The plurality of channel structures may include a blocking insulating layer, a charge storage layer, a tunnel insulating layer, a channel layer, and a core insulating layer. In an embodiment, the channel layer may be formed of a multi-layer structure, and the multi-layer structure may include a polysilicon layer and a silicon germanium layer.

The semiconductor memory device 1120 may be a multi-chip package formed of a plurality of flash memory chips.

The memory controller 1110 may be configured to control the semiconductor memory device 1120, and include a static random access memory (SRAM) 1111, a central processing unit (CPU) 1112, a host interface 1113, an error correction block 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host that is coupled with the memory system 1100. Furthermore, the error correction block 1114 may detect and correct an error that is included in the data that is read from the memory device 1120, and the memory interface 1115 may interface with the memory device 1120. In addition, the memory controller 1110 may further include a read only memory (ROM) or the like that stores code data for interfacing with the host.

Figure 10:
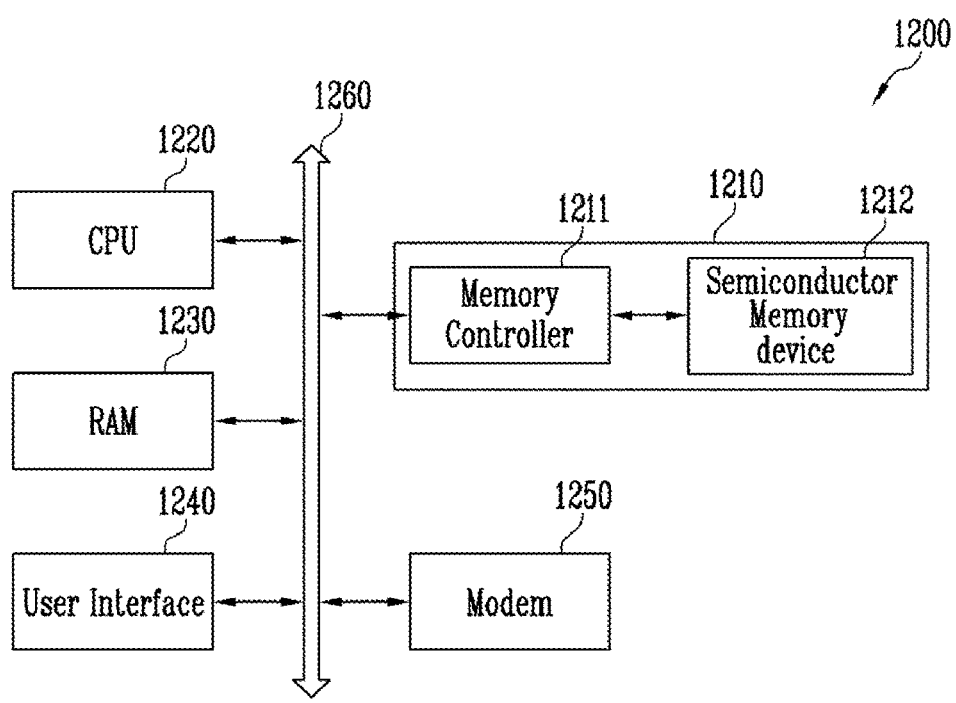
FIG. 10 is a block diagram illustrating the configuration of a computing system according to an embodiment of the present disclosure.

FIG. 10 is a block diagram illustrating the configuration of a computing system according to an embodiment of the present disclosure.

Referring to FIG. 10, the computing system 1200, in accordance with the embodiment of the present disclosure, may include a CPU 1220, a random access memory (RAM) 1230, a user interface 1240, a modem 1250, and a memory system 1210 that are electrically coupled to a system bus 1260. The computing system 1200 may be a mobile device.

The memory system 1210 may include a semiconductor memory device 1212 and a memory controller 1211. The semiconductor memory device 1212 may include a plurality of channel structures configured to pass through a stacked structure in which a plurality of interlayer insulating layers and a plurality of gate electrodes are alternately stacked. The plurality of channel structures may include a blocking insulating layer, a charge storage layer, a tunnel insulating layer, a channel layer, and a core insulating layer. In an embodiment, the channel layer may be formed of a multi-layer structure, and the multi-layer structure may include a polysilicon layer and a silicon germanium layer.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

According to the present disclosure, a channel layer is formed of a multi-layered structure in a semiconductor memory device with a vertical channel structure, thus improving channel mobility and thereby improving the electrical characteristics of a memory cell.

What is claimed is:

1. A semiconductor memory device, comprising:
    a stacked body comprising a plurality of interlayer insulating layers and a plurality of gate electrodes that are alternately stacked on a substrate; and
    a plurality of channel structures configured to vertically pass through the stacked body,
    wherein each of the plurality of channel structures comprises a core insulating layer, a first channel layer, a second channel layer, a third channel layer, a tunnel insulating layer, and a charge storage layer that extend vertically towards the substrate,
    wherein the first channel layer encloses a surface of the core insulating layer, the second channel layer encloses a surface of the first channel layer, and the third channel layer encloses a surface of the second channel layer,
    wherein the first channel layer and the third channel layer are formed of a same material, and
    wherein electron mobility of each of the first channel layer and the third channel layer is higher than electron mobility of the second channel layer.

2. The semiconductor memory device according to claim 1, wherein the first channel layer and the third channel layer are silicon germanium layers, and the second channel layer is a polysilicon layer.

3. The semiconductor memory device according to claim 1, wherein the first channel layer and the third channel layer prevent oxygen from being diffused and introduced from the tunnel insulating layer and the core insulating layer.

4. The semiconductor memory device according to claim 1, wherein the electron mobility of the second channel layer increases due to tensile stress caused by the first channel layer and the third channel layer.

5. A semiconductor memory device, comprising:
    a stacked body comprising a plurality of interlayer insulating layers and a plurality of gate electrodes that are alternately stacked on a substrate; and
    a plurality of channel structures configured to vertically pass through the stacked body,
    wherein each of the plurality of channel structures comprises a core insulating layer, a first channel layer, a second channel layer, a third channel layer, a tunnel insulating layer, and a charge storage layer that extend vertically towards the substrate,
    wherein the first channel layer encloses the core insulating layer, the second channel layer encloses the first channel layer, and the third channel layer encloses the second channel layer,
    wherein the first channel layer and the third channel layer are formed of a same material, and
    wherein electron mobility of the second channel layer is higher than electron mobility of each of the first channel layer and the third channel layer.

6. The semiconductor memory device according to claim 5, wherein the first channel layer and the third channel layer are polysilicon layers, and the second channel layer is a silicon germanium layer.

7. The semiconductor memory device according to claim 5, wherein the electron mobility of the first channel layer increases due to tensile stress caused by the second channel layer and the third channel layer.

8. A method of manufacturing a semiconductor memory device, comprising:
    forming a stacked body by alternately stacking a plurality of interlayer insulating layers and a plurality of sacrificial layers on a substrate;
    forming a plurality of holes configured to vertically pass through the stacked body; and
    successively forming a blocking insulating layer, a charge storage layer, a tunnel insulating layer, a first channel layer, a second channel layer, and a third channel layer on a sidewall of each of the plurality of holes,
    wherein the first channel layer and the third channel layer are formed of a same material, and
    wherein the second channel layer is a material layer having higher electron mobility than each of the first channel layer and the third channel layer.

9. The method according to claim 8, wherein the first channel layer and the third channel layer are formed of a polysilicon layer, and the second channel layer is formed of a silicon germanium layer.

10. The method according to claim 9, wherein the first channel layer, the second channel layer, and the third channel layer are formed by using an ALD process and formed by using a super cycle method in which numbers of Si cycles and Ge cycles are controlled.

11. A method of manufacturing a semiconductor memory device, comprising:
    forming a stacked body by alternately stacking a plurality of interlayer insulating layers and a plurality of sacrificial layers on a substrate;
    forming a plurality of holes configured to vertically pass through the stacked body; and
    successively forming a blocking insulating layer, a charge storage layer, a tunnel insulating layer, a first channel layer, a second channel layer, and a third channel layer on a sidewall of each of the plurality of holes,
    wherein the first channel layer and the third channel layer are formed of a same material, and
    wherein each of the first channel layer and the third channel layer is a material layer having higher electron mobility than the second channel layer.

12. The method according to claim 11, wherein the first channel layer and the third channel layer are formed of a silicon germanium layer, and the second channel layer is formed of a polysilicon layer.

* * * * *